(12) United States Patent
Stochino et al.

(10) Patent No.: US 7,564,304 B2
(45) Date of Patent: Jul. 21, 2009

(54) AUDIO POWER AMPLIFIER APPARATUS

(76) Inventors: Giovanni Stochino, Via Conte di Carmagnola 32, 1-00176 Roma (IT); Secondo Porra', Via Praga 6A, 08048 Nuoro (IT)

( * ) Notice: Subject to any disclaimer, the term of this patent is extended or adjusted under 35 U.S.C. 154(b) by 0 days.

(21) Appl. No.: 12/025,427

(22) Filed: Feb. 4, 2008

(65) Prior Publication Data
US 2008/0186097 A1    Aug. 7, 2008

Related U.S. Application Data

(63) Continuation of application No. PCT/IT2006/000593, filed on Aug. 1, 2006.

(30) Foreign Application Priority Data

Aug. 3, 2005    (IT)    ............... RM2005A0415

(51) Int. Cl.
*H03F 3/45* (2006.01)
(52) U.S. Cl. .............. 330/69; 330/149; 330/195; 381/120
(58) Field of Classification Search .......... 330/69, 330/149, 195; 381/120
See application file for complete search history.

(56) References Cited

U.S. PATENT DOCUMENTS 3,471,798 A    10/1969 Seidel et al.

(Continued)

FOREIGN PATENT DOCUMENTS

IT    1266487    12/1996

(Continued)

OTHER PUBLICATIONS

M. J. Hawksford, "Distortion Correction in Audio Power Amplifiers", JAES vol. 29, No. ½, Jan./Feb. 1981, pp. 27-30.

(Continued)

*Primary Examiner*—Patricia T. Nguyen
(74) *Attorney, Agent, or Firm*—Stanislaus Aksman; Roberts, Mlotkowski, Safran & Cole, P.C.

(57) ABSTRACT

The invention concerns an audio power amplifier apparatus capable of providing at low manufacturing cost extremely low non-linear distortion, even lower than −120 dB, comprising a main power amplifying section the output of which is series connected to a secondary of a coupling transformer T1, in turn connected to the apparatus output, the apparatus being characterized in that the amplifying section provides an output signal Vma having a negative feed-back loop non-inverting gain, and in that it further comprises a cascade of one or more sections, the inputs of which are connected to the output of the input section and to the output of the amplifying section, and the output of which is constituted of a secondary winding of the transformer T1, the cascade being capable to very accurately extract the error signal Ve with respect to the amplified signal Vi from the signal at the output of the amplifying section and to to provide to its output an exact, but anti-phase, copy thereof in a predetermined very wide frequency band, so as to carry out a feed-forward error correction function that, for the first time, is particularly effective in cancelling the error of the amplifying section without interactions with the same and in a very wide frequency band, and in avoiding in a very stable and reliable way, any risk of stress and overload for the transformer T1.

32 Claims, 3 Drawing Sheets

U.S. PATENT DOCUMENTS

| | | | |
|---|---|---|---|
| 3,815,040 A | | 6/1974 | Seidel |
| 4,050,029 A | * | 9/1977 | McFadyen .................. 330/273 |
| 5,357,210 A | | 10/1994 | Miljanic et al. |
| 5,768,696 A | * | 6/1998 | Law ........................ 455/127.1 |
| 5,892,398 A | | 4/1999 | Candy |
| 6,917,233 B1 | | 7/2005 | Waffaoui El |
| 7,279,967 B2 | * | 10/2007 | Quilter ........................ 330/10 |
| 2002/0097090 A1 | | 7/2002 | Smedegaard-Pedersen et al. |
| 2003/0148792 A1 | | 8/2003 | Kimball et al. |
| 2008/0260183 A1 | * | 10/2008 | Hertzberg et al. ........... 381/119 |

FOREIGN PATENT DOCUMENTS

| | | |
|---|---|---|
| WO | 03092156 | 11/2003 |

OTHER PUBLICATIONS

Abstract of E. M. Cherry, "A new Result in Negative-Feedback Theory and its Application to Audio Power Amplifiers", International Journal of Circuit Theory and Applications, vol. 6, Jul. 1978. pp. 265-288.

Abstract of P. J. Walker, "Current Dumping Audio Power Amplifier", Wireless World, vol. 81, Dec. 1975 (Quad). pp. 265-288.

Abstract of G. Stochino, "Audio Design leaps forward?", Electronics World and Wireless World. vol. 100, N. 1703, Oct. 1994. pp. 818-827.

"Audio Power Amplifier Design Handbook" Douglas Self, Third Edition, pp. 39 and 59.

"Self on Audio" Douglas Self, Electronics World 2000 ISBN 0 7506 4765 5, pp. 345, 352.

* cited by examiner

AUDIO POWER AMPLIFIER APPARATUS

CROSS-REFERENCE TO RELATED APPLICATIONS

The present application is a continuation Under 35 U.S.C. §120 and 365 (c) of PCT/IT/2006/000593 filed on Aug. 1, 2006 ("PCT Application"), which claims priority from Italian Application No. RM2005A000415 filed on Aug. 3, 2005, both of which are hereby incorporated by reference in their entirety into the present Application.

The present invention relates to an audio power amplifier apparatus, based on an error correction architecture, comprising a negative feed-back component and a feed-forward correction component, that allows, in a simple, efficient, flexible, reliable, and inexpensive way, to obtain extraordinarily low, both harmonic and intermodulation, distortion values, very high performances in response speed, in transparency of music play, and in whole stability, meeting linear dynamics and distortion requirements even beyond 120 dB.

With the arrival of the most recent digital technologies of recording, processing and storing music audio signals, with related most recent encoding starting from 16 bits (standard Audio CD) up to 24 bits (standard SACD and Audio DVD), linear dynamics requirements of the various components of the digital and/or analog apparatus cascade of audio signal processing and playing have been extended beyond 120 dB, over the whole wide range of interested audio frequencies, i.e. 20 Hz-20 kHz. Such linearity requirements are particularly severe for the power amplifier, dedicated to drive the acoustic speakers with high power levels and often very challenging load impedances.

Architectures of audio power amplifiers with the best distortion values, which are known and/or used in nowadays commercialised industrial products, substantially belong to three different classes.

A first class of power amplifiers is based on architectures employing pure negative feed-back (or simply feed-back) error correction techniques with multiple loops, all included within the primary feed-back loop, in some rare cases with distortions close to the aforementioned requirements. Some examples of such first class of power amplifiers are described in U.S. Pat. No. 5,892,398, entitled "Amplifier Having Ultra-Low Distortion", by M. J. Hawksford in "*Distortion Correction in Audio Power Amplifiers*", JAES, vol. 29, no. 1/2, January/February 1981, pp. 27-30, and by E. M. Cherry in "*A new Result in Negative-Feedback Theory and its Application to Audio Power Amplifiers*", International Journal of Circuit Theory and applications, Vol. 6, pp. 265-288, July 1978.

A second class of power amplifiers is based, as described by P. J. Walker in "*Current Dumping Audio Power Amplifiers*"; Wireless World, vol. 81, pp. 560-562, December 1975 (Quad), on architectures employing mixed, feed-back and/or a feed-forward, error correction techniques within the primary feed-back loop, however with distortions far from the aforementioned requirements.

A third class of power amplifiers is based on architectures employing synergistic error correction techniques, i.e. constituted of a negative feed-back (or simply feed-back) primary loop around the power amplifier, and of an auxiliary feed-forward correction loop, after and outside the feed-back primary loop. Among these architectures, those described by G. Stochino in the Italian Patent No. IT 1266487 and in "*Audio Design leaps forward?*", Electronics World, October 1994, pp. 818-827, Vol. 100, N. 1703, are particularly significant and efficient, which are potentially capable to reach and exceed the aforementioned limit of linear dynamics range of 120 dB.

However, such three classes of power amplifiers suffer from some disadvantages and drawbacks.

As far as the first two classes are concerned, first of all they often require complex and expensive procedures of selecting and coupling components and of final calibration.

Moreover, since they are feed-back type error correction techniques, they need a high product bandwidth-by-whole gain of loop, also taking account of the inner local feed-back loops, with the consequent related drawbacks, such as, for instance, the risk of frequency marginal stability.

Consequently, such first two classes inevitably suffer from an excessive circuit and manufacture complexity.

Furthermore, the number of stages and components through which the main signal passes is large, in particular when a plurality of inner feed-back loops are used in order to obtain lower distortion levels. This generally entails a scarce transparency of the played music signal.

Still, such first two classes suffer from a scarce sturdiness of the circuit architecture with respect to production process tolerances and, hence, from a not easy reproducibility of performances and from a limited production yield.

Finally, the whole production cost of the product is inevitably too high.

All these disadvantages generally makes the use of the first two classes of power amplifier architectures for very low distortion products intended for a commercial use particularly difficult and/or burdensome.

Also the first embodiments of the third class of power amplifiers mentioned above, although they are potentially the most promising ones, since they do not suffer from most of the disadvantages of the first two classes, presently have not yet reached adequate levels of efficiency and economy with their manufactured architectures, at least such levels as to make their use at industrial level attractive.

In particular, such first embodiments of the third class, as described by G. Stochino in the paper "*Audio Design leaps forward?*", have a circuit configuration wherein the power amplifier has an inverting gain, with the consequent drawbacks of scarce flexibility (for instance, the input impedance is strictly fixed), low precision (high output offset voltage due to bias and offset currents), low stability and high thermal drift, and excess of noise.

Moreover, the architecture on which such embodiments are based does not wholly achieve the potentialities of the error correction voltage injection technique, since the feed-forward loop has only 30 dB of rejection.

Still, the residual of useful signal in the feed-forward loop is generally excessive, with consequent risk of overload for the transformer included within the architecture, and hence with limited linearity and reliability performances.

Furthermore, such embodiments of the third class do not wholly solve in an inexpensive, reliable, and stable way the problem of dc coupling of the error correction voltage injection transformer.

Moreover, the actual performances related to the distortion are lower than the potential ones (90 dB compared to 120 dB as required).

Finally, such first embodiments of the third class need a very elaborate calibration procedure, that entails a consequently high production cost.

It is a specific object of the present invention to provide an audio power amplifier apparatus that allows, in a simple, efficient, flexible, reliable, and inexpensive way, to obtain low, both harmonic and intermodulation, distortion values, along with very high performances in response speed and in transparency of music play.

It is still an object of the present invention to provide such an apparatus that introduces substantially neglectable noise levels and that has high sturdiness and whole stability characteristics.

It is always an object of the present invention to provide such an apparatus that meets linear dynamics and distortion requirements even not lower than 120 dB.

It is further an object of the present invention to provide such an apparatus capable to be calibrated through a simple and inexpensive calibration procedure.

It is therefore specific subject matter of the present invention an audio power amplifier apparatus, capable to receive as input an external audio signal and to provide an amplified signal Vo for a load connected to at least one apparatus output terminal, the apparatus comprising an input section, capable to receive as input said external audio signal and to output an audio signal Vi, a main power amplifying section having an input connected to the output of the input section, the apparatus being characterised in that the amplifying section provides an output signal Vma having non-inverting gain with respect to the input audio signal Vi, and in that it further comprises a cascade of one or more sections, having two inputs, which are one non-inverting and the other inverting, the former being connected to the output of the input section and the latter being connected to the output of the power amplifying section, and an output terminal coinciding with a corresponding terminal out of two terminals of a first secondary of a transformer T1, that is connected to said at least one apparatus output terminal, the load being connected to the output of the power amplifying section and in series to the first secondary of the transformer T1, so that the amplified signal Vo is equal to the difference between a signal Vmo obtained from the signal Vma at the output of the power amplifying section and a signal Vb present across the two terminals of the first secondary of the transformer T1, the cascade being capable to extract an error component Ve, with respect to the amplified signal Vi, from the signal Vma at the output of the amplifying section, and to stably provide substantially a copy of such error component, without interactions with the amplifying section, across the two terminals of the first secondary of the transformer T1, the cascade having such a frequency response that the signal Vb present across the two terminals of the first secondary of the transformer T1 has substantially the same behaviour of amplitude and phase as the error component Ve in a first predetermined frequency band.

In other words, the transformer T1 is part of a section of the cascade, and the load is series connected to the first secondary of the transformer T1 and to the output of the power amplifying section, either after or before the first secondary of the transformer T1. In the first case, the cascade may comprise an output terminal coinciding with a first terminal out of the two terminals of the first secondary of the transformer T1, that is connected to an apparatus output terminal, the second terminal of the first secondary of the transformer T1 being connected to the output of the power amplifying section. In the second case, the cascade may comprise an output terminal coinciding with a second terminal out of the two terminals of the first secondary of the transformer T1, that is connected to a first apparatus output terminal, the first terminal of the first secondary of the transformer T1 being connected to a reference voltage, preferably to ground, the apparatus comprising a second output terminal connected to the output of the power amplifying section.

In particular, the signal Vmo may be obtained from the signal Vma either through a direct connection to the output of the power amplifying section, whereby Vmo=Vma, or through an interposed section.

Always according to the invention, the cascade may have a substantially unitary whole gain with respect to the error component Ve both when dc operating and in the first predetermined frequency band, in particular independently from the gain of the cascade single sections.

Still according to the invention, the amplifying section may comprise a, preferably negative feed-back, non-inverting type power amplifier stage, operating according to an class A and/or B class and/or class AB linear amplification technique, and/or according to a class D switching amplification technique, the power amplifier stage preferably including one or more integrated circuit and/or solid state discrete component, for example Mosfet or bipolar transistors, and/or vacuum device, for example tubes, amplifiers.

In particular, the negative feedback (or simply feed-back) allows to reduce variations due to distortion and instability of the error signal Ve within limits controllable by the error correction cascade. Other circuit configurations of the amplifying stage, capable to similarly reduce such variations, are usable for implementing the amplifying section.

Furthermore according to the invention, the cascade may comprise an error extracting section comprising a low-pass filtering stage, receiving the signal Vi coming from the input section as input, capable to reproduce the behaviour of the frequency response of the amplifying section, the low-pass filtering stage being connected to the non-inverting input of a first operational amplifier in negative feed-back configuration, the inverting input of which is connected to the output of the amplifying section so as to substantially provide at the output of the error extracting section a copy of the error component Ve, the frequency response of the error extracting section having a Vi-side gain equal to the dc gain of the amplifying section, the gain after the low-pass filtering stage being constant within a second predetermined frequency band including the first predetermined frequency band.

Always according to the invention, the low-pass filtering stage of the error extracting section comprises first adjustable impedance passive electronic means, capable to calibrate the apparatus so that the frequency response of the filtering stage in the first predetermined frequency band is substantially equal, in phase and amplitude, at most apart from a scale factor, to the frequency response of the amplifying section, and the negative feed-back circuit configuration of the first operational amplifier may comprise second adjustable impedance passive electronic means, capable to calibrate the apparatus so that the Vi-side dc gain of the error extracting section is substantially equal to the dc gain of the amplifying section.

Still according to the invention, the first and second adjustable impedance passive electronic means may comprise two respective potentiometers.

Furthermore according to the invention, the cascade may further comprise an error correction section, the input of which is connected to the output of the error extracting section and the output of which is the output of the cascade, having a frequency response with unitary dc gain in a third predetermined frequency band including the first predetermined frequency band, so that the frequency response of the error correction section is substantially equal, in phase and amplitude, to the dc response of the same error correction section all over the first predetermined frequency band.

Always according to the invention, the error correction section may comprise third adjustable impedance passive electronic means, capable to calibrate the apparatus so that the dc gain of the same error correction section is unitary.

Still according to the invention, the third adjustable impedance passive electronic means may comprise a potentiometer.

Furthermore according to the invention, the output of the amplifying section may be connected to the secondary of the transformer T1 through a load decoupling filtering section, having a second order frequency response, capable to insulate and to separate the amplifying section from the load connected to the apparatus output at frequencies exceeding the first predetermined frequency band, and the error correction section may comprise an amplifying stage, the output of which is connected to a primary of the transformer T1, having a frequency response that allows to achieve that the frequency response of the cascade is substantially equal to the frequency response of the load decoupling filtering section in the first predetermined frequency band.

Always according to the invention, the amplifying stage of the error correction section may comprise fourth adjustable impedance passive electronic means, capable to adjust its frequency response, preferably capable to adjust a zero of its frequency response.

Still according to the invention, the fourth adjustable impedance passive electronic means may comprise a variable and/or adjustable capacitor.

Furthermore according to the invention, the amplifying stage of the error correction section may be based on a second operational amplifier, biased such that a unitary dc negative feed-back is set around the second operational amplifier, through resistive means, and that the dc component of the voltage signal at the output of the second operational amplifier is forced to zero, and that is coupled, when ac operating, through resistive and capacitive means, to a second secondary of the transformer T1, for making a negative feed-back loop around the second operational amplifier, in particular in order to obtain the desired frequency response of the output signal Vb and to neutralise and cancel the magnetic flux within the core of the transformer T1.

Always according to the invention, the error correction section may further comprise at its input a high-pass filtering stage, capable to prevent dc and low frequency components at the input of the same error correction section from making the transformer T1 saturate.

Still according to the invention, the filtering stage of the error correction section may be deselectable through switching bypass means.

Furthermore according to the invention, the error correction section may further comprise a stage for limiting the voltage at the input of the same error correction section, capable to avoid phenomena of overload and/or saturation and/or instability of the transformer T1.

Always according to the invention, the load decoupling filtering section may comprise fourth adjustable impedance passive electronic means, capable to adjust the second order frequency response of the same load decoupling filtering section.

Still according to the invention, the fifth adjustable impedance passive electronic means may comprise one or more variable and/or adjustable capacitors, for instance a bank of capacitors insertable through switched contacts.

Furthermore according to the invention, the first predetermined frequency band may range from 20 Hz to 100 kHz. In particular, the second and third predetermined frequency bands are advantageously much higher than the first predetermined frequency band, preferably much higher than 100 kHz.

Always according to the invention, the input section may comprise two or more input terminals, capable to receive said external audio signal, which are connected to a band-pass filtering stage, capable to prevent signals at frequency outside said band from accessing the apparatus Still according to the invention, the band of the band-pass filtering stage may range from 1 Hz to 150 kHz.

Furthermore according to the invention, the input section may further comprise, after the band-pass filtering stage, an amplifying stage, capable to insulate the input impedance from the rest of the amplifier apparatus.

Always according to the invention, the amplifying stage of the input section may be capable to convert said external audio signal from balanced to unbalanced.

Still according to the invention, the apparatus may further comprises a section for limiting the voltage of said audio signal Vi provided by the input section, capable to limit the voltage value thereof within a predefined range varying from a minimum value SL to a maximum value SH, whereby SL<Vi<SH.

Furthermore according to the invention, said predefined range may be adjustable through sixth adjustable impedance passive electronic means.

Always according to the invention, the limit values of said predefined range may have equal module and they may be opposite to each other, whereby SL=−SH.

Still according to the invention, the voltage limiting section may include a window comparator stage, comprising two comparators, the inverting input of the first one and the non-inverting input of the second one being connected to the output of the input section, the non-inverting input of the first comparator being connected to an upper reference voltage value SH, the inverting input of the second comparator being connected to a lower reference voltage value SL, the outputs of the two comparators controlling a timed and resettable actuator capable to attenuate said audio signal Vi provided by the input section.

Furthermore according to the invention, said timed and resettable actuator may comprise a relay capable to ground the output of the input section.

Always according to the invention, the upper and lower reference voltage values SH and SL may be determined by a resistive ladder connected between two supply voltages.

Still according to the invention, the resistive ladder may be further parallel connected to a variable resistance branch, preferably comprising a potentiometer.

BRIEF DESCRIPTION OF THE DRAWINGS

The present invention will now be described, by way of illustration and not by way of limitation, according to its preferred embodiments, by particularly referring to the Figures of the enclosed drawings, in which.

In the Figures, alike elements are indicated by same reference numbers.

DETAILED DESCRIPTION

The inventor has developed an architecture for audio power amplifier having very low, both harmonic and intermodulation, distortion. In particular, for obtaining extraordinarily low distortion values, two different error correction techniques, complementary and synergistic, are employed in an inventive and particularly efficient way. The first one, of negative feed-back (or simply feed-back) type, is applied to a primary power amplifier, in order to reduce the error to the minimum values compatible with the need of not compromising other performances (such as response speed, transparency in music play, overall stability and costs). The second technique, of the type known as feed-forward correction, is applied after the primary amplifier and without interactions with the preceding feed-back loop, in order to further reduce, by a factor larger than 100, the residual (but still too high for obtaining very high performances) error remained after the application of the first negative feed-back technique. In particular, the primary power amplifier has a non-inverting gain, with the known associated benefits of high flexibility, precision, stability and low noise. The resulting effect is an exceptional level of sound transparency and very low distortion. The architecture is inventive from both the point of view of configuration and performances, and the industrial point of view, since, along with excellent performances, it has optimal characteristics of stability and reproducibility at limited manufacturing costs.

Figure 1:
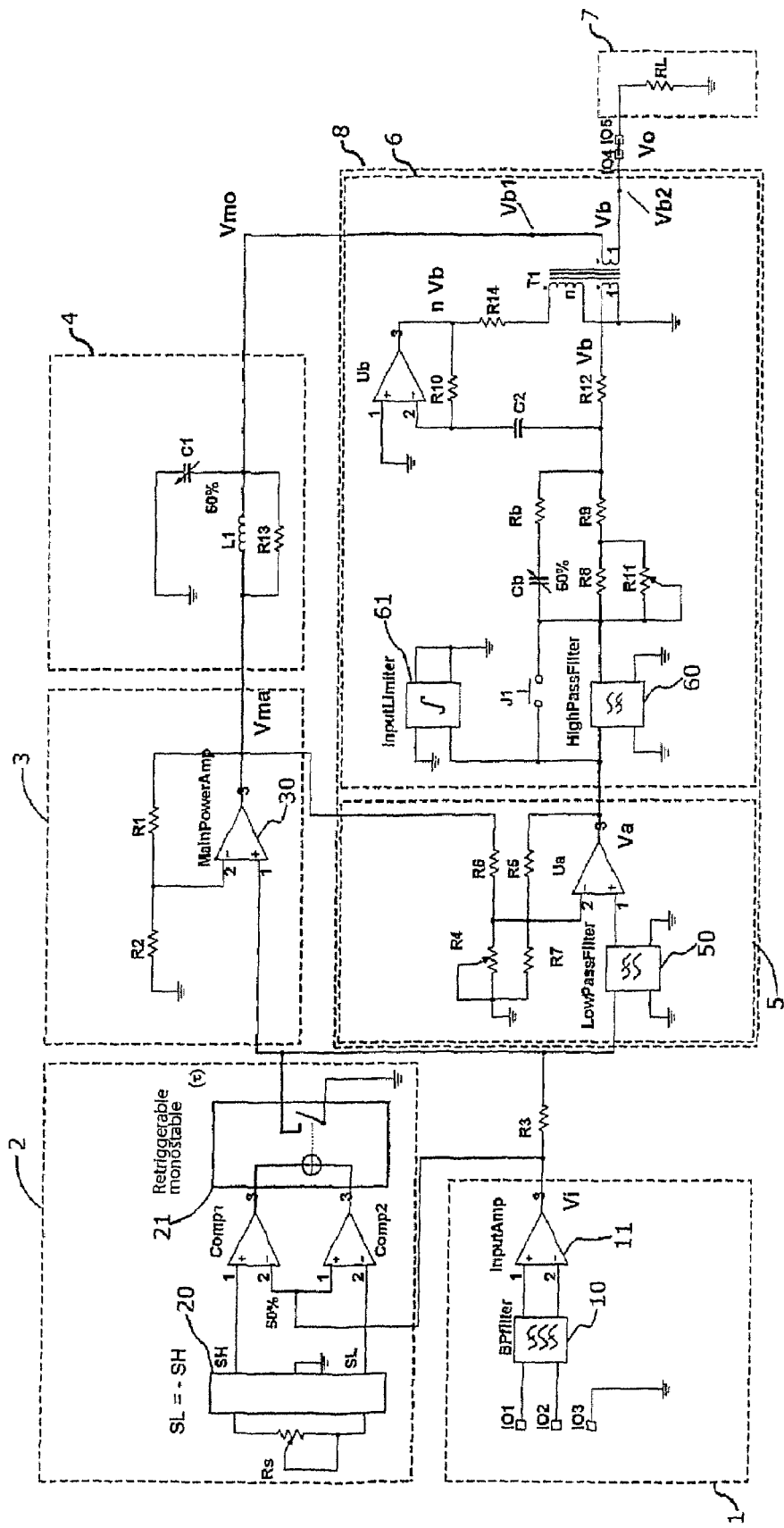
FIG. 1 shows a circuit diagram of the preferred embodiment of the amplifier apparatus according to the invention.

FIG. 1 shows the general architecture of the preferred embodiment of the amplifier apparatus according to the invention, the components and the circuit configuration of which are immediately comprehensible by those skilled in the art.

In particular, such architecture comprises an input section 1, that is capable to operate as input interface for the audio signal, that may be either balanced or unbalanced, offering the impedance level specified for the termination of the audio signal source. In particular, section 1 comprises an input connector having three terminals IO1, IO2, and IO3, on which it receives the input audio signal, after which it comprises a band-pass filtering stage 10, the band of which is preferably included between 1 Hz and 150 kHz, that prevents undesired off-band disturbance signals, such as dc components with related fluctuations and radiofrequency or RF interferences, from accessing the amplifier apparatus. Section 1 further comprises an amplifying stage 11, capable to insulate the input impedance from the rest of the amplifier apparatus and to convert, when necessary, the input signal from balanced to unbalanced for the successive audio signal processing.

The general architecture of the preferred embodiment of the amplifier apparatus further comprises an input voltage adjustable limitation section 2, capable to draw the signal at the output of the amplifying stage 11 of the input section 1 for limiting its voltage value Vi, sent as input to the successive sections of the amplifier apparatus, within a predefined range varying from a minimum value SL to a maximum value SH (whereby SL<Vi<SH), so as to prevent the amplifier apparatus output power from exceeding, even if only due to accidental reasons, a predetermined value. Preferably, said predefined range is adjustable by the user, more preferably through a potentiometer Rs; still more preferably, the limit values of said range have modules which are equal to each other (i.e., SL=−SH). Circuit design and operation of the section 2 will be shown in detail below, with particular reference to FIG. 3. In any case, it should be noted that other embodiments of the amplifier apparatus may not include the input voltage adjustable limitation section 2.

The preferred embodiment of the amplifier apparatus still comprises a main power amplifying section 3, provided with an amplifying stage, based on a power operational amplifier 30 in non-inverting configuration, that amplifies the input signal Vi, coming from the input section 1 (and possibly limited by the section 2), bringing it to the level corresponding to the specified rated power. In particular, the amplifying section 3 may adopt one or more from various amplifying techniques, for example class A and/or AB linear amplification, class D switching amplifiers or derived, and it may further employ several technologies for the amplifying stages, such as tubes, bipolar transistors, FET/Mosfet transistors.

After the main power amplifying section 3, the preferred embodiment of the amplifier apparatus still comprises a load decoupling filtering section 4, that has the main function of insulating and separating the amplifier 30 from the load 7 (schematised with a resistor RL) at high frequencies, preferably at frequencies higher than 100 kHz.

Figure 2:
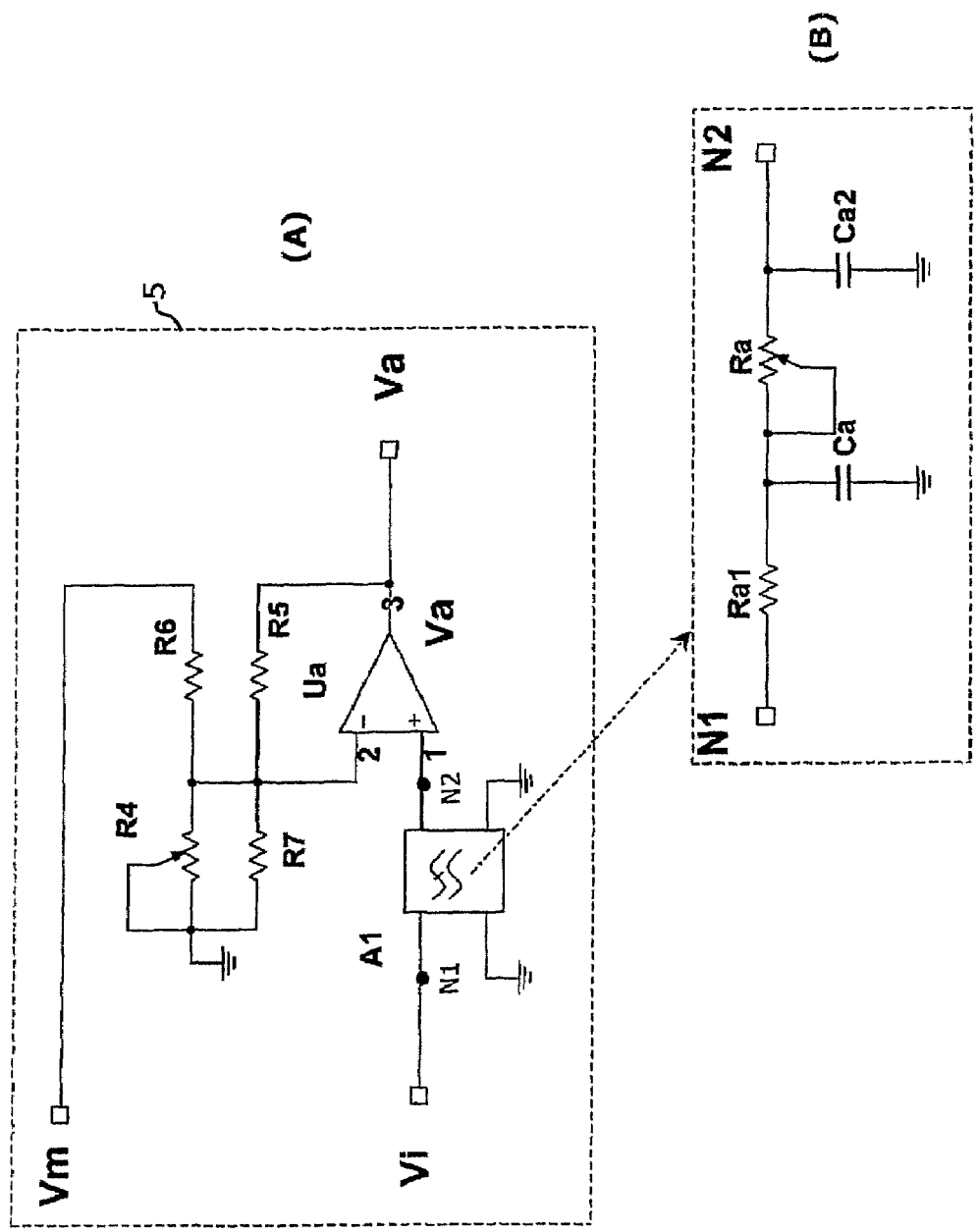
FIG. 2 shows a first portion of the diagram of FIG. 1.

The preferred embodiment of the amplifier apparatus still comprises a cascade 8 of two coupled sections the whole goal of which is that of extracting the error Ve from section 3 and of generating an exact copy thereof that is galvanically floating and antiphase at the output. In particular, the cascade 8 comprises an error extracting section 5, connected after the input section 1 and the main power amplifying section 3, that has the fundamental goal of extracting the undesired error signal Ve to correct from the output voltage Vma of the section 3, by eliminating the useful input signal component Vi from Vma. Section 5 comprises a low-pass filtering stage 50 before the non-inverting input of an operational amplifier Ua, capable to extract the error signal Ve. In particular, the filtering stage 50 has the essential purpose of reproducing, apart from the gain value, the behaviour of the frequency response of the main power amplifying section 3, and hence of allowing an effective cancellation of Vi. Circuit design and operation of section 5 will be shown in greater detail below, with particular reference to FIG. 2, when it will be shown that the cancellation of the useful input signal Vi from Vma at low frequencies and high frequencies is carried out through two simple respective calibration procedures.

After the error extracting section 5, the cascade 8 of the preferred embodiment of the amplifier apparatus still comprises an error correction section 6, comprising an amplifying stage based on an operational amplifier Ub the output of which is preferably dc connected to the primary winding of a coupling transformer T1 through which it injects the error correction signal, with proper phase, into the circuit 7 of the load RL. Control of bias of section 6 is carried out by resistor R10, with R10>>R12 for not reducing the loop gain too much and making the closed loop frequency response substantially independent from R10, that sets a dc unitary feed-back around the operational amplifier Ub, and by the decoupling capacitor C2; in particular, such bias configuration efficiently forces the voltage dc component at the output node of the operational amplifier Ub to zero, so as to prevent dc currents from passing in the transformer primary winding and thus to obtain the proper operation of section 6 in every operating condition.

Section 6 further comprises at its input a high-pass filtering stage 60, possibly deselectable through bypass means J1, that is used if necessary for properly decoupling section 6 from the error extracting section 5 at very low frequencies, in order to prevent, if necessary, dc components and too high low frequency drift of the input voltage Va from making transformer T1 saturate. Section 6 still comprises an input voltage Va limiting stage 61, for avoiding overload and/or saturation and/or instability phenomena of the transformer T1, which would cause losses of performances and sturdiness of the whole amplifier apparatus, thus increasing (instead of decreasing) distortion.

Finally, the preferred embodiment of the amplifier apparatus comprises an output connector IO4, connected to the secondary of the transformer T1 of section 6, at which it provides the output amplified signal. The output connector IO4 is capable to be connected, through a corresponding connector IO5, to the circuit 7 of the load RL, that represents the impedance of the load of the power amplifier.

In order to better understand the architecture and the operation of the present invention, the operating modes of the preferred embodiment of the amplifier apparatus will be described in the following, similar modes being valid for other embodiments. In particular, in the following it will be first illustrated a first order analysis of the various sections of the amplifier apparatus, which analysis is particularly valid for low frequencies of the band thereof, and afterwards a second order analysis, mostly valid for the highest frequencies of the band of the amplifier apparatus.

With reference to FIG. 1, it may be observed that the voltage Vma at the output of the operational amplifier 30 of the amplifying stage of the main power amplifying section 3 is equal to $$Vma \approx Vi\, Gm/(1+s/pm)+Ve \quad [1]$$

where:
- Vi is the input signal, coming from the input section 1, possibly limited by section 2;
- Gm=(1+R1/R2) is the dc gain of section 3,
- pm is the dominant pole, and
- Ve is the error residual voltage, comprising offset, drift, distortion and noise.

Since the main power amplifying section 3 has, in a first order analysis, a $1^{st}$ order response, i.e. with a single pole, the low pass filter 50 of the error extracting section 5 (reproducing the behaviour of the frequency response of the main power amplifying section 3) has a $1^{st}$ order response as well, characterised by a pole pa. Preferably, in order to accurately capture even the highest frequency harmonics of the error voltage Ve, the operational amplifier Ua has a transition frequency $F_T$ much higher than that of the main power amplifying section 3, i.e.

$$F_{T\_5} \gg G_m p_m.$$

Taking account of the preferred circuit configuration of the low pass filter 50, and considering that in the present context of first order analysis such filter is made as a single pole circuit, shown in FIG. 2B (between nodes N1 and N2 of section 5 shown in FIG. 2A), the voltage Va at the output of section 5 is therefore equal to $$Va \approx Vi\, Ga/(1+s/pa)-Vi\, Gm/(1+s/pm)-Ve \approx Vir(f)-Ve \quad [2]$$

where:
- Ga=(1+R5/(R6//R4//R7) is the dc gain of section 5 in respect to Vi, and
- pa=1/CaRa is the pole of the low pass filter 50.

Through two simple calibration steps, respectively consisting of the adjustment of potentiometers R4 and Ra of FIGS. 2A and 2B, it is possible to achieve $$Ga=Gm \quad [3]$$

and $$pa=pm \quad [4]$$

whereby the term Vir(f) of formula [2] tends to zero (Vir(f)→0), and this formula is advantageously reduced to $$Va=Vir(f)-Ve \approx -Ve \quad [5]$$

where Vir(f)≪Vi is the (undesired) residual of Vi, remaining after the two steps of calibrating R4 and Ra. In other words, through the two simple calibration steps the main power amplifying section 3 is capable to extract the error Ve in a reliable and efficient way.

Still referring to FIG. 1, in order to accurately reproduce even the highest frequency harmonics of the error voltage Ve, the error correction section 6 preferably has a frequency response with a dominant pole pb, and proper unitary gain frequency, such that $$F_{T\_6} \gg p_m.$$

For the first order analysis of the error correction section 6, it may be assumed that Cb=0. Then, considering the formula [5] (Va≈−Ve), the voltage Vb=Vb1−Vb2 across each of the two secondary windings (preferably, but not necessarily, having the same number of turns) of the transformer T1 is equal to $$Vb=-Ve[-R12/(R9+R8//R11)]/(1+s/pb) \quad [6]$$

Since preferably section 6, the closed loop gain of which tends to unity, has frequency response with a dominant pole pb much larger than the dominant pole pm of the main power amplifying section 3 (i.e. pb≫pm), through a further simple step of calibrating the potentiometer R11, such to produce $$[-R12/(R9+R8//R11)]=-1 \quad [6bis]$$

formula [6] becomes $$Vb \approx Ve \quad [7]$$

For completing the first order analysis, it may be assumed that the load decoupling filtering section 4 has a unitary frequency response at every frequency (assumption that is valid at low frequencies for the preferred embodiment of the apparatus). In this case:

$$Vmo=Vma=Vi\, Gm/(1+s/pm)+Ve$$

The voltage Vo across the load is given by the simple combination of Vmo (=Vb1) (containing the error Ve to correct) with Vb (=Vb1−Vb2) (that in turn contains the copy of the error Ve to correct):

$$Vo=Vmo-Vb \approx Vi\, Gm/(1+s/pm)+Ve-Vb \quad [8]$$

i.e., taking account of formula [7], it follows that $$Vo \approx Vi\, Gm/(1+s/pm) \quad [8bis]$$

Formulas [8] and [8bis] summarise the basic mechanism through which the error Ve introduced by the main power amplifying section 3 is corrected (i.e. substantially cancelled): the (first order) residual error Ve present at the output of the power operational amplifier 30 is removed from the output voltage Vo present across the load, by adding an antiphase copy −Vb=−Ve of the same error to it.

In particular, this occurs because the first secondary of the transformer T1, providing the copy of the error voltage (Vb=Vb1−Vb2=Ve), is series connected to the load. Other embodiments of the apparatus according to the invention may alternatively provide that the first secondary of the transformer T1, instead of being series connected before the load RL (so as to have one of the terminals of the load grounded), could be series connected after the load RL; in other words, these alternative embodiments may exchange the position of the first secondary of T1 with the position of the load, so as to have Vb2 connected to ground (or to any other reference constant voltage) and the load RL connected between the output of section 4 and Vb1: since it is however an exchange of two dipoles in series, the same functional effect of correction of the error Ve is obtained.

It is evident the simplicity of the correction, that is carried out in a reliable way through an adjustment comprising only three calibration steps.

Since the cancellation of the error is never complete, but there is always a residual Ver(f) of error, however small it is, the efficiency of the error correction mechanism, by means of the supplementary feed-forward loop comprising sections 5 and 6, is measured by the ratio $$\rho(f)=Ve(f)/Ver(f) \qquad [9]$$

of the error voltage Ve(f) to the output residual error voltage Ver(f), also called as "error rejection coefficient", that is extremely high for the amplifier apparatus according to the invention.

A second order analysis of the amplifier apparatus of FIG. 1 will now be conducted, in which the main power amplifying section 3 is not considered, for which the first order analysis in the considered context is sufficient. In this regard, it is only worth considering that, as said before, in order to compensate even second order effects of the amplifying section 3, the low pass filter 50 of section 5 preferably has a $2^{nd}$ order response, in order to reduce as much as possible the residual Vir(f) of the input signal Vi present at the output of the error extracting section 5 (see formula [5]) even at high frequencies. In this regard, through the amplifier apparatus according to the invention it is possible to obtain values of Vir lower than Vi by even more than 90 dB within the frequency range 20 Hz-20 kHz.

Instead, a second order accuracy is necessary for the amplitude and frequency responses of the sections involved in processing the error signal Ve, in particular the load decoupling filtering section 4, the error extracting section 5, and the error correction section 6 of FIG. 1, when it is desired, as in the present case, to obtain rejection factors ρ(f) equal to or larger than two orders of magnitude all over and beyond the audio range (typically up to 100 kHz, which frequency coincides with the fifth harmonic of 20 kHz, upper limit of the audio band). In fact, the second order effects in such sections cannot be neglected any more, otherwise it is impossible to correct the spectral components, included the most troublesome intermodulation products, of the error voltage Ve(f) at the highest frequencies. In particular, the amplifier apparatus according to the invention takes account of such second order effects, minimising them and compensating them in a simple and efficient way. In fact, thanks to its configuration and the simple procedures used for introducing the necessary phase compensations, it is possible to obtain rejection values stably larger than 40 dB up to beyond 100 kHz, and without side effects (such as, for instance, instability at low and high frequency, excessive overload stress, interactions between the two feed-back and feed-forward loops when the load impedance varies).

For considering the second order effects affecting the ρ(f), the two paths through which the error voltage Ve propagates before the combination-cancellation process at the output of the transformer T1 are examined in the following, which are namely the path constituted of section 4 and the one constituted of the cascade 8 of the two sections 5 and 6.

The transfer function of the error voltage Ve through the load decoupling filtering section 4 is equal to:

$$Veo=Ve(1+s/zo)/(1+ks/po+s^2/po^2) \qquad [10]$$

wherein parameters k, zo and po substantially depend on components L1, C1 and R13 of the same section 4.

As far as the cascade 8 of sections 5 and 6 is concerned, it should be considered that, in order to introduce a zero zb into the transfer function of the error correction section 6, capacitor Cb and resistor Rb have non-null values. Preferably, the cascade 8 is characterised by two dominant poles pa and pb, already considered in formulas [2] and [6] respectively, in the band of interest (i.e. with frequency lower than 100 kHz).

After the execution of the previously mentioned three calibration steps, whereby formulas [3], [4], and [6bis] are true, the whole second order transfer function Veb/Ve of the cascade of sections 5 and 6 is equal to $$Veb=-Ve(1+s/zb)/[(1+s/pa)(1+s/pb)] \qquad [11]$$

where zb is the zero purposely introduced through capacitor Cb for adjusting the phase at the highest frequencies, so that the two formulas [10] and [11] are equal as much as possible in the band of interest, preferably equal to 20 Hz-100 kHz.

It should be noted that the expressions of Veo and Veb, respectively [10] and [11], are both second order functions, with the same unitary value at low frequency. A peculiar advantage of the architecture of the amplifier apparatus according to the invention is that the parameters zo, k, po, and zb of the transfer functions of section 4 and of the cascade of sections 5 and 6 may be defined and adjusted with respect to pa and pb, so as to make the values of the two functions [10] and [11] substantially equal, in magnitude and phase, up to 100 kHz, with an accuracy close to the second order, i.e. the values of formulas [10] and [11] are equal with a precision up to 1 out of 100. Therefore, in correspondence of the output connector IO4, where the push-pull combination of the two signals Veo and Veb is present, also the second order components of the error voltage Ve may be substantially cancelled, leaving only a small residual Ver tending to zero within the frequency band of interest (included between 20 Hz and 100 kHz):

$$Ver(f)=Veo(f)-Veb(f) \to 0 \qquad [12]$$

(for f included between 20 Hz and 100 kHz)

In practice, it is sufficient a fourth calibration step for adjusting the capacity of the capacitor Cb so as to shift the pole zb and to allow the performances at the highest frequencies to be optimised. It is thus possible to obtain rejection values ρ(f) stably larger than 40 dB all over the whole frequency range of interest, i.e. from 20 Hz up to 100 kHz.

By way of example, if the initial error value Ve (due to distortion) of the main power amplifying section 3 is equal to −80 dB (0.01%), which value is typical for commercial amplifiers of middle-high category, it is therefore possible to reach output error levels lower by 40 dB, i.e. equal to −120 dB.

Figure 3:
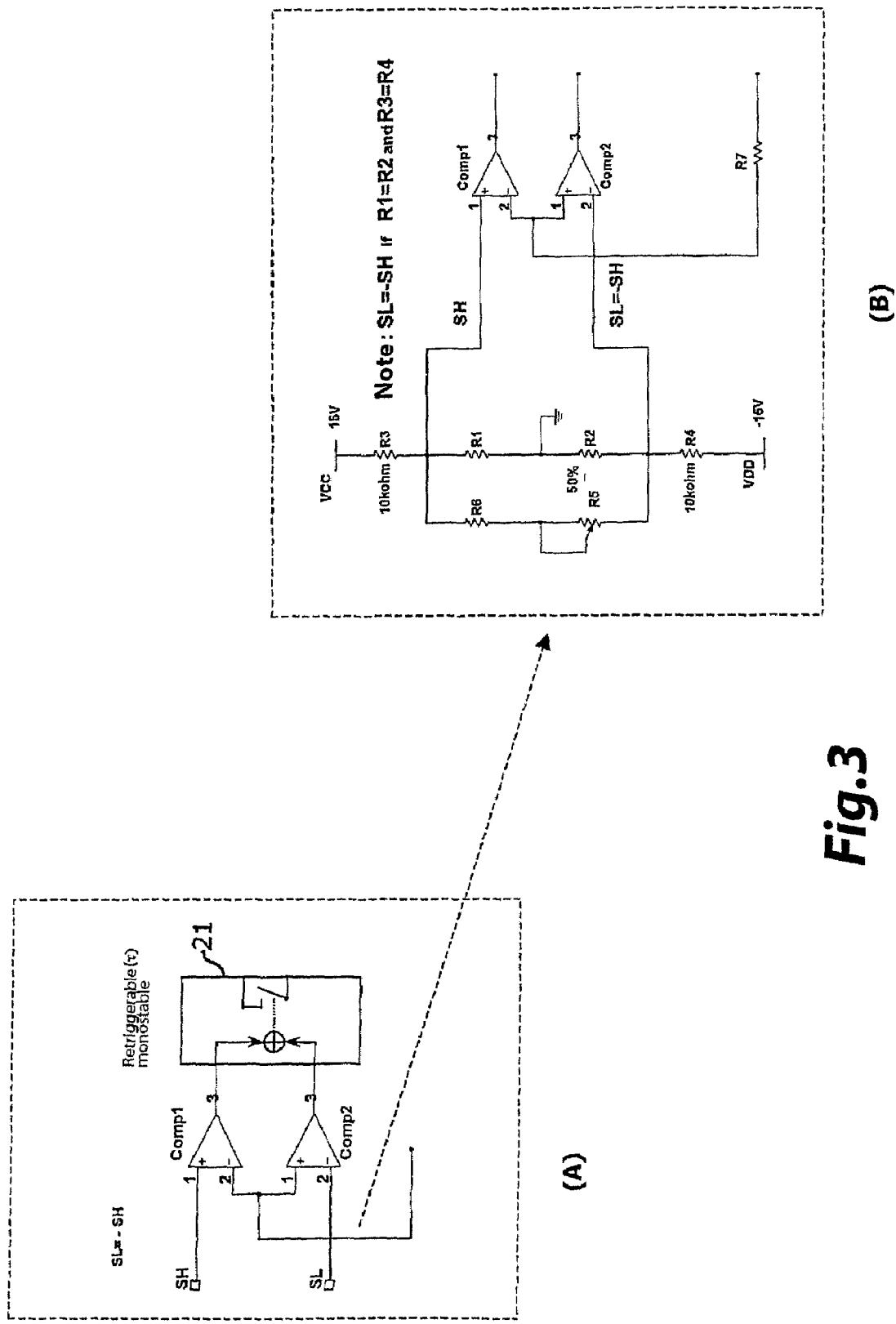
FIG. 3 shows a second portion of the diagram of FIG. 1.

FIG. 3 shows a preferred circuit configuration of the input voltage adjustable limitation section 2, which as a result limits the output voltage (and hence power) level of the amplifier apparatus.

As shown in FIG. 3A, such section 2 includes a window comparator stage, comprising two comparators Comp1 and Comp2, the inverting input of the first one and the non-inverting input of the second one being connected (either directly or, more preferably, through a resistor R7, as shown in FIG. 3B) to the output of the input section 1, the voltage V1 of which is therefore applied to these inputs of the two comparators. The non-inverting input of the comparator Comp1 is then connected to an upper reference voltage value SH, while the inverting input of the comparator Comp2 is connected to a lower reference voltage value SL. The outputs of the two comparators Comp1 and Comp2 control (for instance through a component operating as an OR gate) a timed (with time equal to τ) and resettable actuator (i.e. a retriggerable monostable), capable to insert an adequate attenuation along the path of the signal Vi. By way of example, in FIGS. 1 and 3 such actuator is represented by a relay 21 capable to carry out a contact with ground.

Section 2 checks that the voltage V1 at the input of the main power amplifying section 3 is included within the range SL to SH. As shown in FIG. 1, the limit values of such range are determined by a passive component stage 20. Preferably, as shown in FIG. 3B, such stage is made through a resistive ladder, connected between two supply voltages Vcc and Vdd, in parallel with a variable resistance branch (Rs in FIG. 1), constituted of a series of a resistor R6 and a potentiometer R5; in particular, in the case when the two supply voltages Vcc and Vdd have opposite values, and the resistive ladder is balanced with respect to the circuit ground (i.e. R1=R2 and R3=R4), then the limit values SH and SL are opposite to each other (SH=−SL), and they are adjustable by means of the potentiometer R5. Therefore, in the case when the signal Vi exceeds the voltage value SH (for both positive and negative voltages), the limitation section 2 inserts, as described above, the attenuation of the signal Vi, that remains as active until the input signal Vi returns within the acceptable range included between −SL and +SH for a time equal to at least monostable timing τ.

The advantage of the input voltage adjustable limitation section 2 is its adjustability, the response speed and its non-interference with the quality (in terms of noise and distortion) of the signal Vi under processing in conditions of normal operation, i.e. with section 2 being inactive.

The innovative aspects of the amplifier apparatus according to the invention are numerous.

In particular, the error extracting section 5 is particularly suitable for extracting the error voltage Ve from the voltage Vma at the output of the amplifying section 3, cancelling at the same time the component of signal Vi, by means of two simple calibration procedures for cancelling Vi at low frequencies (by adjusting R4 in FIG. 1) and at high frequencies (by adjusting Ra in FIG. 2B).

Moreover, the error correction section 6, thanks to the amplifying stage comprising the operational amplifier Ub (in general, integrated or hybrid), the transformer T1, the components R8-R12 and Rb-Cb, is capable to determine a proper closed loop frequency response of section 6, that, along with that of section 5, allows to substantially cancel the error voltage present at the output of the amplifying section 3.

The advantages offered by the amplifier apparatus according to the invention are significant.

First of all, it wholly exploits all over the audio frequency range (20 Hz-20 kHz) the potentialities of the error correction voltage injection technique of the third class of power amplifiers mentioned above.

Moreover, the amplifier apparatus according to the invention is capable to meet and often to exceed the limit of 120 dB related to the linearity requirements.

Still, it does not require particular procedures of selecting and matching components.

Furthermore, the amplifier apparatus according to the invention offers optimal and intrinsically stable performances, solving in an efficient and inexpensive way all the problems related to the feed-forward correction loop, associated with the residual of useful signal and to the use of the transformer dc coupled to the correction amplifier (which transformer has a crucial role in such correction technique). Consequently, the amplifier apparatus substantially reduces to zero the continuous current in the primary winding of the transformer T1 at any temperature and in any operating conditions. Also, it limits the stresses on the transformer T1 at low frequencies within acceptable values in order not to exceed the allowable flux limits, efficiently limiting overload phenomena, thus increasing performances and reliability. Still, the configuration of the apparatus eliminates any possible interaction with the circuit of the secondary of the del transformer T1 crossed by high currents of the load 7.

Moreover, the amplifier apparatus according to the invention ensures particular transparency and brilliance in music play, since the primary power amplifying section 3 may have, under same performances, a number of stages and components reduced in respect to the first and second classes of power amplifiers mentioned above.

Still, the amplifier apparatus according to the invention has a great sturdiness with respect to the production tolerances, with a consequently optimal reproducibility and production yield, and with reduced manufacture costs.

The preferred embodiments have been above described and some modifications of this invention have been suggested, but it should be understood that those skilled in the art can make variations and changes, without so departing from the related scope of protection, as defined by the attached claims.

The invention claimed is:

1. An audio power amplifier apparatus, capable to receive as input an external audio signal and to provide an amplified signal Vo for a load connected to at least one apparatus output terminal (IO4), the apparatus comprising an input section, capable to receive as input said external audio signal and to output an audio signal Vi, a main power amplifying section having an input connected to the output of the input section, wherein the amplifying section provides an output signal Vma having non-inverting gain with respect to the input audio signal Vi, and in that it further comprises a cascade of one or more sections, having two inputs, which are one non-inverting and the other inverting, the former being connected to the output of the input section, and the latter being connected to the output of the power amplifying section, and an output terminal coinciding with a corresponding terminal out of two terminals of a first secondary of a transformer T1, that is connected to said at least one apparatus output terminal, the load being connected to the output of the power amplifying section and in series to the first secondary of the transformer T1, so that the amplified signal Vo is equal to the difference between a signal Vmo obtained from the signal Vma at the output of the power amplifying section and a signal Vb present across the two terminals (Vb1, Vb2) of the first secondary of the transformer T1 (Vb=Vb1−Vb2), the cascade being capable to extract an error component Ve, with respect to the amplified signal Vi, from the signal Vma at the output of the amplifying section, and to stably provide substantially a copy of such error component, without interactions with the amplifying section, across the two terminals (Vb1, Vb2) of the first secondary of the transformer T1, the cascade having such a frequency response that the signal Vb present across the two terminals (Vb1, Vb2) of the first secondary of the transformer T1 has substantially the same behaviour of amplitude and phase as the error component Ve in a first predetermined frequency band.

2. An apparatus according to claim 1, wherein the cascade has a substantially unitary overall gain with respect to the error component Ve both when dc operating and in the first predetermined frequency band.

3. An apparatus according to claim 1, wherein the amplifying section (3) comprises a, preferably negative feed-back, non-inverting type power amplifier stage, operating according to an class A and/or B and/or AB linear amplification technique, and/or according to a class D switching amplification technique, the power amplifier stage preferably including one or more integrated circuit and/or solid state discrete component, for example Mosfet or bipolar transistors, and/or vacuum device, for example tubes, amplifiers.

4. An apparatus according to claim 1, wherein the cascade comprises an error extracting section comprising a low-pass filtering stage, receiving the signal Vi coming from the input section as input, capable to reproduce the behaviour of the frequency response of the amplifying section, the low-pass filtering stage being connected to the non-inverting input of a first operational amplifier (Ua) in negative feed-back configuration, the inverting input of which is connected to the output of the amplifying section so as to substantially provide at the output of the error extracting section a copy of the error component Ve, the frequency response of the error extracting section having a Vi-side gain equal to the dc gain of the amplifying section, the gain after the low-pass filtering stage being constant within a second predetermined frequency band including the first predetermined frequency band.

5. An apparatus according to claim 4, wherein the low-pass filtering stage of the error extracting section comprises first adjustable impedance passive electronic means (Ra), capable to calibrate the apparatus so that the frequency response of the filtering stage in the first predetermined frequency band is substantially equal, in phase and amplitude, at most apart from a scale factor, to the frequency response of the amplifying section (3), and in that the negative feed-back circuit configuration of the first operational amplifier (Ua) comprises second adjustable impedance passive electronic means (Ra), capable to calibrate the apparatus so that the Vi-side dc gain of the error extracting section is substantially equal to the dc gain of the amplifying section.

6. An apparatus according to claim 5, wherein the first and second adjustable impedance passive electronic means comprise two respective potentiometers (Ra, R4).

7. An apparatus according to claim 4, wherein the cascade further comprises an error correction section, the input of which is connected to the output of the error extracting section and the output of which is the output of the cascade, having a frequency response with unitary dc gain in a third predetermined frequency band including the first predetermined frequency band, so that the frequency response of the error correction section is substantially equal, in phase and amplitude, to the dc response of the same error correction section all over the first predetermined frequency band.

8. An apparatus according to claim 7, wherein the error correction section comprises third adjustable impedance passive electronic means (R11), capable to calibrate the apparatus so that the dc gain of the same error correction section is unitary.

9. An apparatus according to claim 8, wherein the third adjustable impedance passive electronic means (R11) comprises a potentiometer.

10. An apparatus according to claim 7, wherein the output of the amplifying section is connected to the secondary of the transformer T1 through a load decoupling filtering section, having a second order frequency response, capable to insulate and to separate the amplifying section from the load connected to the apparatus output (IO4) at frequencies exceeding the first predetermined frequency band, and in that the error correction section comprises an amplifying stage, the output of which is connected to a primary of the transformer T1, having a frequency response that allows to achieve that the frequency response of the cascade is substantially equal to the frequency response of the load decoupling filtering section in the first predetermined frequency band.

11. An apparatus according to claim 10, wherein the amplifying stage of the error correction section comprises fourth adjustable impedance passive electronic means (Cb), capable to adjust its frequency response, preferably capable to adjust a zero (zb) of its frequency response.

12. An apparatus according to claim 11, wherein the fourth adjustable impedance passive electronic means comprises a variable and/or adjustable capacitor (Cb).

13. An apparatus according to claim 10, wherein the amplifying stage of the error correction section is based on a second operational amplifier (Ub), biased such that a unitary dc negative feed-back is set around the second operational amplifier (Ub), through resistive means (R10), and that the dc component of the voltage signal at the output of the second operational amplifier (Ub) is forced to zero, and that is coupled, when ac operating, through resistive and capacitive means (R12, C2), to a second secondary of the transformer T1, for making a negative feed-back loop around the second operational amplifier (Ub), in order to set the closed loop gain and neutralise and cancel the magnetic flux in the transformer T1.

14. An apparatus according to claim 10, wherein the error correction section further comprises at its input a high-pass filtering stage, capable to prevent dc and low frequency components at the input of the same error correction section from making the transformer T1 saturate.

15. An apparatus according to claim 14, wherein the filtering stage of the error correction section is deselectable through switching bypass means (J1).

16. An apparatus according to claim 10, wherein the error correction section further comprises a stage for limiting the voltage (Va) at the input of the same error correction section, capable to avoid phenomena of overload and/or saturation and/or instability of the transformer T1.

17. An apparatus according to claim 10, wherein the load decoupling filtering section comprises fourth adjustable impedance passive electronic means (C1), capable to adjust the second order frequency response of the same load decoupling filtering section.

18. An apparatus according to claim 17, wherein the fifth adjustable impedance passive electronic means comprises one or more variable and/or adjustable capacitors (C1).

19. An apparatus according to claim 1, wherein the first predetermined frequency band ranges from 20 Hz to 100 kHz.

20. An apparatus according to claim 1, wherein the input section comprises two or more input terminals (IO1, IO2, IO3), capable to receive said external audio signal, which are connected to a band-pass filtering stage, capable to prevent signals at frequency outside said band from accessing the apparatus.

21. An apparatus according to claim 20, wherein the band of the band-pass filtering stage ranges from 1 Hz to 150 kHz.

22. An apparatus according to claim 20, wherein the input section further comprises, after the band-pass filtering stage, an amplifying stage, capable to insulate the input impedance from the rest of the amplifier apparatus.

23. An apparatus according to claim 22, wherein the amplifying stage of the input section is capable to convert said external audio signal from balanced to unbalanced.

24. An apparatus according to claim 1, wherein it further comprises a section for limiting the voltage of said audio signal Vi provided by the input section, capable to limit the voltage value thereof within a predefined range varying from a minimum value SL to a maximum value SH, whereby SL<Vi<SH.

25. An apparatus according to claim 24, wherein said predefined range is adjustable through sixth adjustable impedance passive electronic means (R5).

26. An apparatus according to claim 24, wherein the limit values of said predefined range have equal module and they are opposite to each other, whereby SL=−SH.

27. An apparatus according to claim 24, wherein the voltage limiting section includes a window comparator stage, comprising two comparators (Comp1, Comp2), the inverting input of the first one and the non-inverting input of the second one being connected to the output of the input section, the non-inverting input of the first comparator (Comp1) being connected to an upper reference voltage value SH, the inverting input of the second comparator (Comp2) being connected to a lower reference voltage value SL, the outputs of the two comparators (Comp1, Comp2) controlling a timed and resettable actuator capable to attenuate said audio signal Vi provided by the input section.

28. An apparatus according to claim 27, wherein said timed and resettable actuator comprises a relay capable to ground the output of the input section.

29. An apparatus according to claim 27, wherein the upper and lower reference voltage values SH and SL are determined by a resistive ladder connected between two supply voltages (Vcc, Vdd).

30. An apparatus according to claim 29, wherein said predefined range is adjustable through sixth adjustable impedance passive electronic means (R5), wherein the resistive ladder is further parallel connected to a variable resistance branch, preferably comprising a potentiometer (R5).

31. An apparatus according to claim 1, wherein the cascade comprises an output terminal coinciding with a first terminal (Vb2) out of the two terminals (Vb1, Vb2) of the first secondary of the transformer T1, that is connected to an apparatus output terminal (IO4), the second terminal (Vb1) of the first secondary of the transformer T1 being connected to the output of the power amplifying section.

32. An apparatus according to claim 1, wherein the cascade comprises an output terminal coinciding with a second terminal (Vb1) out of the two terminals (Vb1, Vb2) of the first secondary of the transformer T1, that is connected to an apparatus first output (IO4), the first terminal (Vb2) of the first secondary of the transformer T1 being connected to a reference voltage, preferably to ground, the apparatus comprising a second output terminal connected to the output of the power amplifying section.

* * * * *